(12) United States Patent
Udayakumar et al.

(10) Patent No.: US 8,778,700 B2
(45) Date of Patent: Jul. 15, 2014

(54) HYDROGEN BARRIER FOR FERROELECTRIC CAPACITORS

(71) Applicant: Texas Instruments Incorporated, Dallas, TX (US)

(72) Inventors: Kezhakkedath R. Udayakumar, Dallas, TX (US); Scott R. Summerfelt, Garland, TX (US); Ted S. Moise, Dallas, TX (US); Manoj K. Jain, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/770,781

(22) Filed: Feb. 19, 2013

(65) Prior Publication Data

US 2013/0164933 A1    Jun. 27, 2013

Related U.S. Application Data

(62) Division of application No. 12/718,691, filed on Mar. 5, 2010, now Pat. No. 8,440,508.

(60) Provisional application No. 61/158,152, filed on Mar. 6, 2009.

(51) Int. Cl.
| | | |
|---|---|---|
| *H01L 21/00* | (2006.01) | |
| *H01L 21/82* | (2006.01) | |
| *H01L 21/4763* | (2006.01) | |
| *H01L 21/768* | (2006.01) | |
| *H01L 49/02* | (2006.01) | |
| *H01L 27/115* | (2006.01) | |

(52) U.S. Cl.
CPC .......... *H01L 21/76843* (2013.01); *H01L 28/57* (2013.01); *H01L 27/11509* (2013.01)
USPC .......... 438/3; 438/129; 438/627; 257/E21.664

(58) Field of Classification Search
USPC .................................. 257/E21.664; 438/129
See application file for complete search history.

(56) References Cited

U.S. PATENT DOCUMENTS

| | | | |
|---|---|---|---|
| 8,148,798 B2 * | 4/2012 | Yamagata | 257/532 |
| 2001/0005624 A1 * | 6/2001 | Aoyagi et al. | 438/622 |
| 2001/0044205 A1 | 11/2001 | Gilbert et al. | |
| 2006/0170019 A1 * | 8/2006 | Ozaki et al. | 257/295 |

OTHER PUBLICATIONS

Wu et al., Impact of Sinter Process and Metal Coverage on Transistor Mismatching and Parameter Variations in Analog CMOS Technology, 2007 IEEE International Conference on Microelectronic Test Structures, Mar. 19-22, Texas Instruments, Tokyo, Japan.

* cited by examiner

*Primary Examiner* — Daniel Luke
(74) *Attorney, Agent, or Firm* — Rose Alyssa Keagy; Frederick J. Telecky, Jr.

(57) ABSTRACT

An integrated circuit containing a FeCap array. The FeCap array is at least partially surrounded on the sides by hydrogen barrier walls and on the top by a hydrogen barrier top plate. A method for at least partially enclosing a FeCap array with hydrogen barrier walls and a hydrogen barrier top plate.

7 Claims, 21 Drawing Sheets

HYDROGEN BARRIER FOR FERROELECTRIC CAPACITORS

CROSS-REFERENCE TO RELATED APPLICATIONS

This application is a divisional of U.S. patent application Ser. No. 12/718,691 filed Mar. 5, 2010, which claims priority, under U.S.C.§119(e), to U.S. Provisional Application 61/158,152 (Texas Instruments docket number TI-67271 and entitled "Hydrogen Barrier for Ferroelectric Capacitors"), filed Mar. 6, 2009, the contents of both are incorporated herein by reference.

FIELD OF THE INVENTION

This invention relates to the field of integrated circuits. More particularly, this invention relates to providing a hydrogen barrier to protect ferroelectric capacitors from hydrogen degradation.

DETAILED DESCRIPTION

Figure 1A:
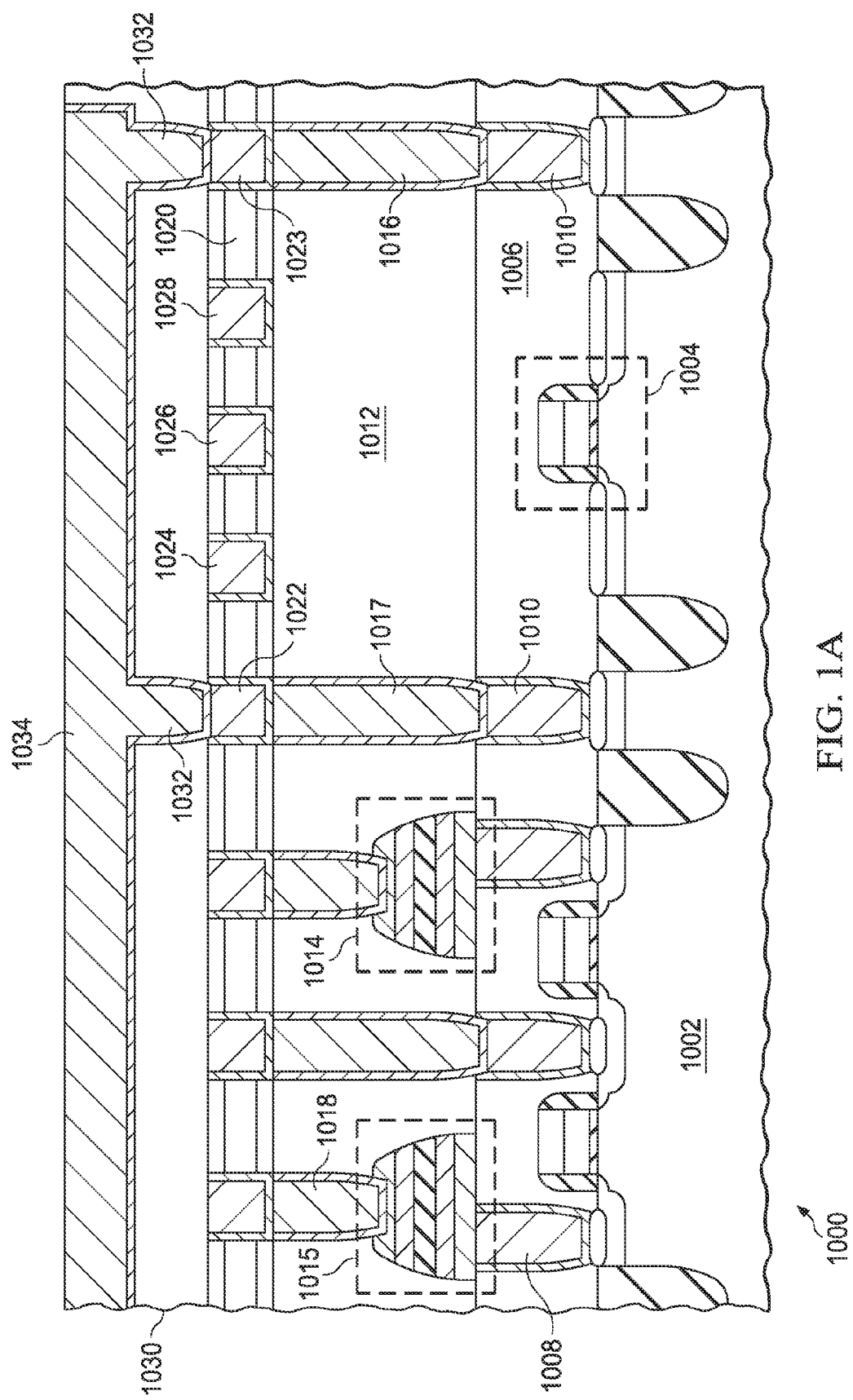
FIGS. 1A & 1B are cross-section and top down views of an integrated circuit according to one embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Ferroelectric capacitors (FeCaps) are frequently used in Ferroelectric memories (FRAM), high-k capacitors, piezoelectric devices, and pyroelectric devices. The construction of the ferroelectric capacitors may occur in a CMOS process flow after the formation of the transistor layer (e.g. after 'front-end' processing), but before the formation of the metallization or interconnection layers (e.g. before 'back-end' processing). Generally, many back-end processing steps may include the use of hydrogen. For example, hydrogen may be used in forming trench etch-stop layers, etch clean operations, copper sintering, and other process steps. This hydrogen may diffuse into the ferroelectric capacitor material, causing degradation in the electric properties, including degraded switched polarization of FRAM memory cells.

A final step in most conventional CMOS process flows is a hydrogen anneal or forming gas (N2+H2) anneal (which may be a step of heating a semiconductor wafer to around 400 C. for up to an hour or more). The purpose of this anneal is to passivate the interface states to tighten the CMOS transistor threshold voltage (Vt) distributions, and to passivate the silicon defects to reduce diode leakage. Because hydrogen degrades FeCaps, some CMOS flows containing FeCaps omit the hydrogen anneal. However, omitting the final hydrogen anneal may improve FeCap electrical properties at the expense of increased transistor variability and diode leakage. In some flows—such as those containing analog circuits—skipping the final hydrogen anneal may not be an option.

By forming a hydrogen barrier around the sides and on top of the FeCap array, a final hydrogen anneal (also called hydrogen sinter) may be performed to improve the CMOS transistors without degrading the electrical properties of the FeCaps.

The term "FeCap array" refers to an area in an integrated circuit containing one or more ferroelectric capacitors.

The term "wall seal" refers to a hydrogen barrier wall that is formed at least partially around an FeCap array to block hydrogen from diffusing to and degrading the FeCaps. This wall seal may be formed by first etching a trench around the FeCap array and then filling it with a hydrogen barrier material. An example is a copper damascene process where a trench is etched, lined with TaN (which is a good hydrogen barrier), and then filled with copper. The wall seal may also be formed by depositing a layer of hydrogen barrier material (such as TiN), and then patterning and etching it to form a wall seal (as in an Al or AlCu process).

The term "top plate seal" refers to a layer of hydrogen barrier material that completely covers the top of an FeCap array, thereby blocking the diffusion of hydrogen into the FeCap array from above the FeCap array.

Figure 1B:
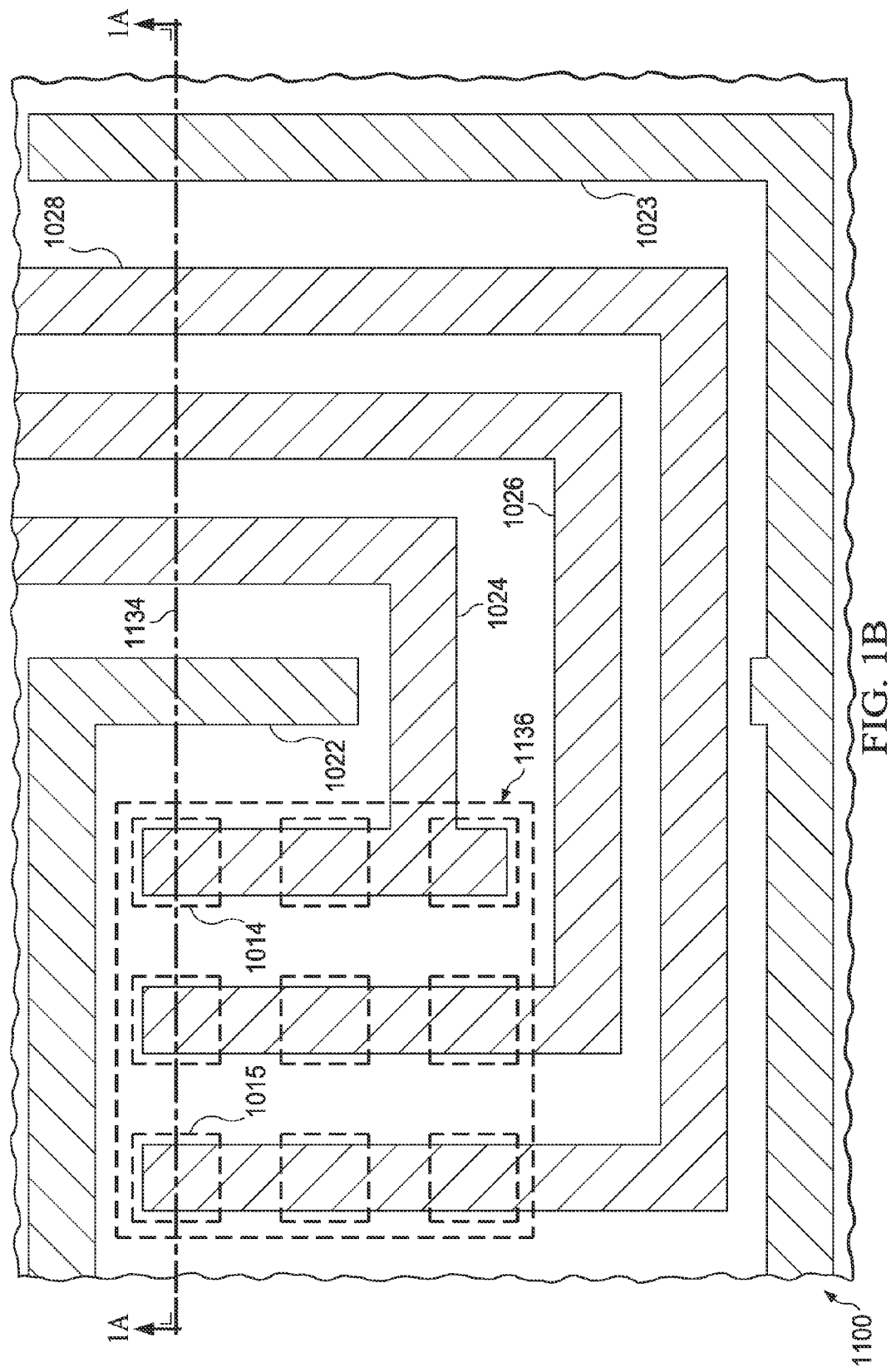

FIG. 1A and 1B are a cross sectional view and a top down view respectively of an integrated circuit (1000) containing FeCaps (1014) and (1015) according to an example embodiment.

Integrated circuit (1000) in FIG. 1A contains a substrate (1002); transistors (1004); a first premetal dielectric (PMD1) (1006); first contacts (1008); first contact wall seals (1010); ferroelectric capacitors (FeCaps), (1014) and 1015); second premetal dielectric (PMD2) (1012); second contacts (1018); second contact wall seals (1016) and (1017); interlevel dielectric 1 (IMD1) (1020); metal-1 wall seals (1022) and (1023); metal-1 interconnect signal leads, (1024), (1026), and (1028); interlevel dielectric 2 (IMD2) (1030); via-1 wall seals (1032); and top plate seal (1034). The wall seals, (1010), (1016), (1017), (1022), (1023), and (1032) are trenches that surround sides of the FeCap array (1136) and are lined or filled with a hydrogen blocking material. These wall seals (which are similar to scribe seals) may prevent hydrogen from diffusing to the FeCaps from the sides and degrading the electrical properties of the FeCap array (1136). The metal-1 top plate seal (1034) may be a solid block of hydrogen barrier material that covers the FeCap array and prevents the diffusion of hydrogen into the FeCap array (1136) from above.

FIG. 1B is a top down view of the top plate seal pattern (1100) which overlies the FeCap array (1136). The cross sectional view in FIG. 1A, is taken along line (1134) as shown in FIG. 1B. In this embodiment, the path length of the metal-1 interconnect signal leads, (1024), (1026), and (1028), which supply signals to the FeCap array (1136) is made longer by routing the leads between metal-1 wall seal (1022) and an extension of metal-1 wall seal (1023) that is attached to one side of the opening in the metal-1 wall seal (1022). This metal-1 wall seal extension (1023) increases the distance that hydrogen must diffuse to reach the FeCaps (1014) and (1015). This is one example method of increasing the hydrogen diffusion path.

Figure 2C:
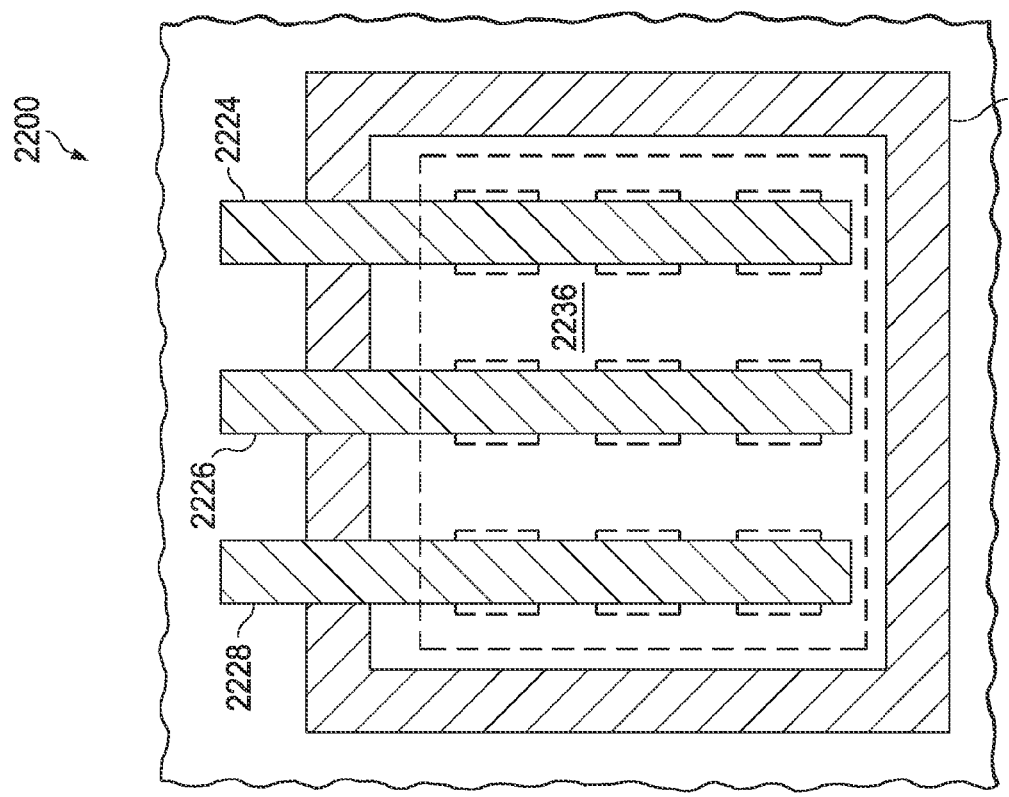
FIG. 2A through FIG. 2C are illustrations of integrated circuits formed according to embodiments.
Figure 2A:
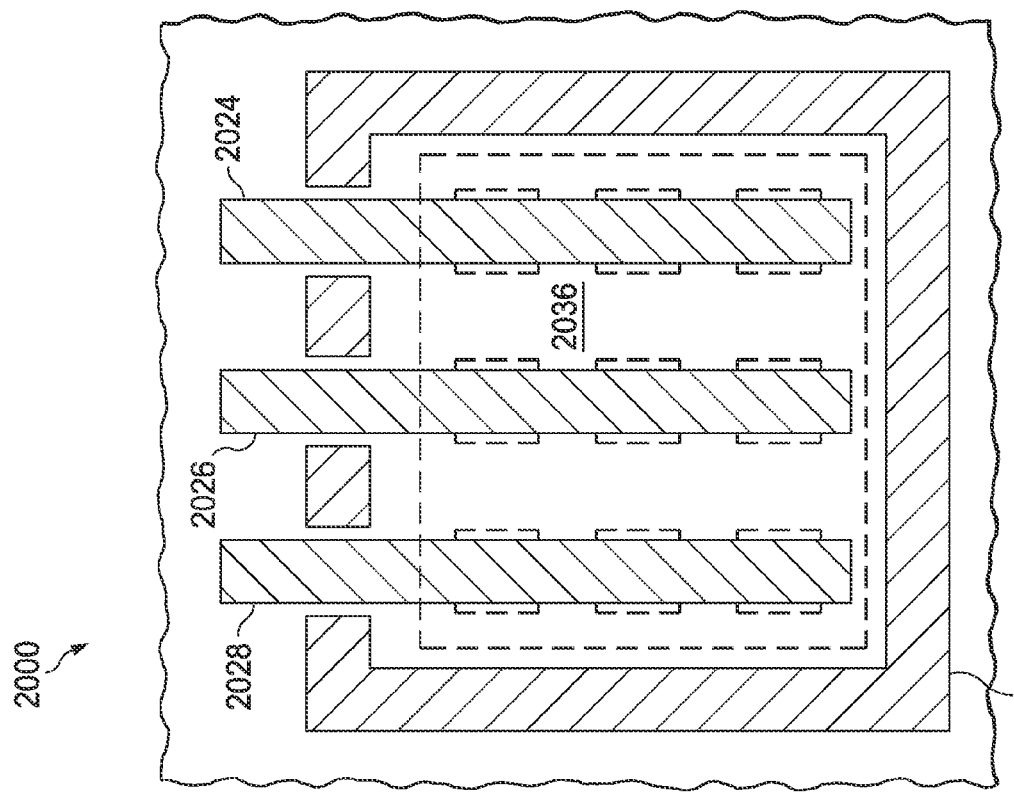
Figure 2B:
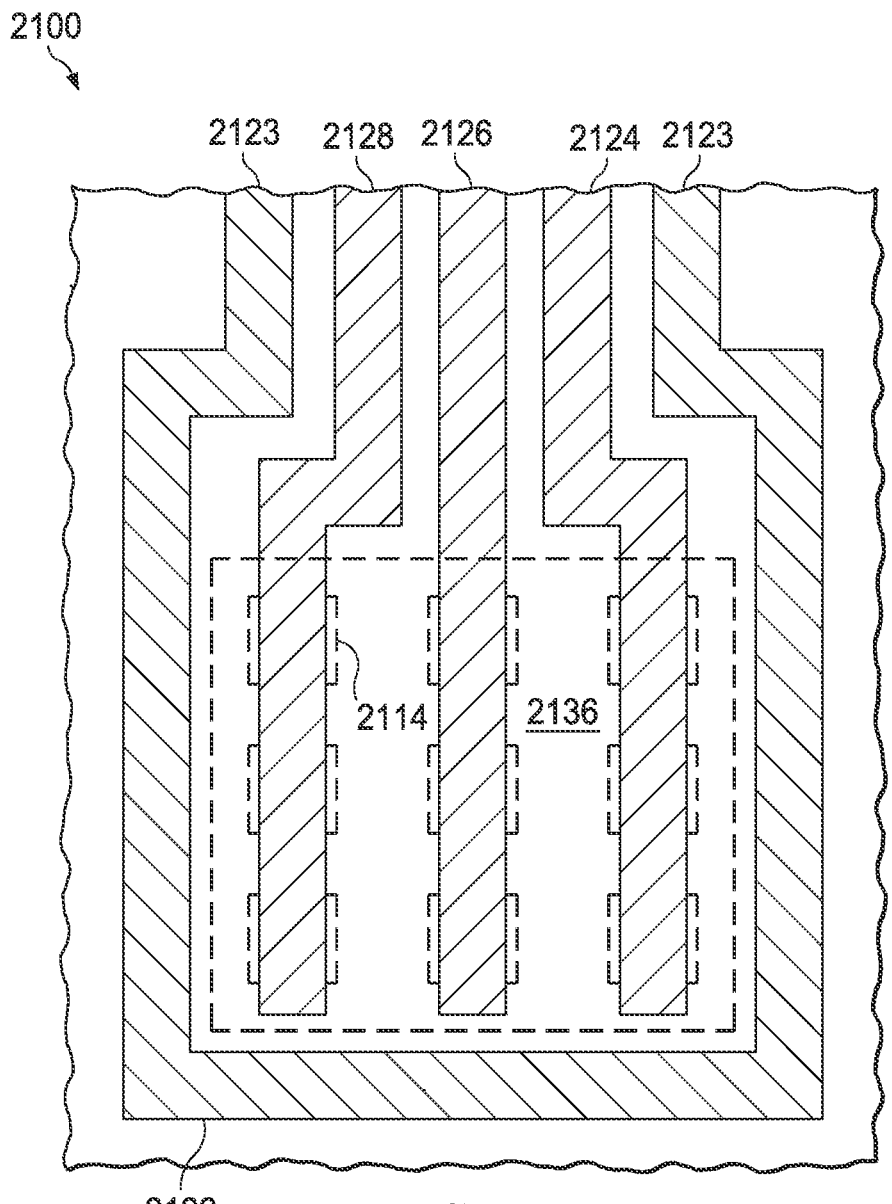

FIGS. 2A, 2B, and 2C are top down views of interconnect and side seal patterns according to additional embodiments. In the embodiment (2000) shown in FIG. 2A, interconnect signal leads (2024), (2026), and (2028) are brought out from FeCap array (2036) through slots in wall seal (2020). The path length for the signal leads (2024), 2026), and (2028) may be shorter than in pattern (1100) in FIG. 1B, and the path length for hydrogen diffusion to reach the FeCaps may also be shorter.

In the embodiment (2100) shown in FIG. 2B, the wall seal extensions (2123) are attached to each side of the gaps in wall seal (2122). The interconnect signal leads (2124), (2126), and (2128) pass through the gaps in wall seal (2122) as they extend away from the FeCap array (2136). In this embodiment, the wall seal extensions (2123) may increase the diffusion length for hydrogen to reach the FeCaps (2114) in the FeCap array (2136).

In the embodiment (2200) shown in FIG. 2C, the wall seal (2222) is filled with a hydrogen barrier dielectric material such as SiN. In this embodiment, the trenches for wall seal (2222) may be patterned, etched, and filled using a first photoresist pattern and the trenches for interconnect signal leads (2224), 2226), and (2228) may be patterned, etched, and filled using a second photoresist pattern. Although double patterning, double etching, and double filling adds cost to the process flow, the wall seal (2222) surrounding the FeCap array (2236) in this embodiment may form a higher integrity hydrogen barrier by forming a continuous hydrogen barrier between the wall seal (2222) and the interconnect signal leads, (2224), (2226), and (2228).

An example process flow describing the formation of a hydrogen barrier seal around a FeCap array is described in FIGS. 3A through 3L. Like reference numerals are used throughout the figures to designate similar or equivalent elements.

Figure 3A:
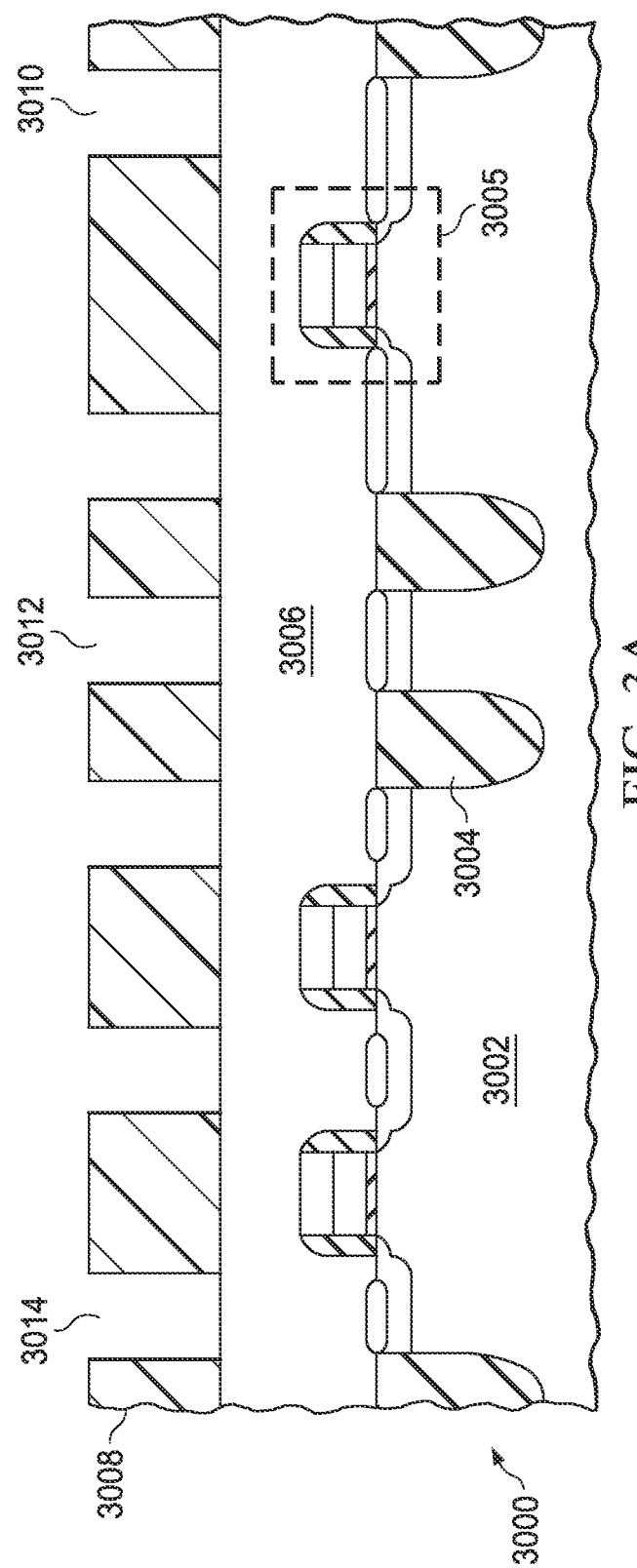
FIG. 3A through FIG. 3L are illustrations of steps in the fabrication of integrated circuits formed according to embodiments.

FIG. 3A is a cross section of an example FeCap integrated circuit (3000) that has been processed up to and including the first contact photoresist pattern (3008). The integrated circuit (3000) is built on a substrate (3002) and includes shallow trench isolations (3004), transistors (3005), and the PMD1 (3006). The first contact photoresist pattern (3008) has been formed on the PMD1 layer (3006). The openings in the first contact photoresist pattern (3008) may correspond to locations (3010), (3014) for first contacts that will connect to the transistors (3005), locations (3012) for the first contact wall seal, and locations (3014) for contacts to a FeCap bottom electrode.

Figure 3B:
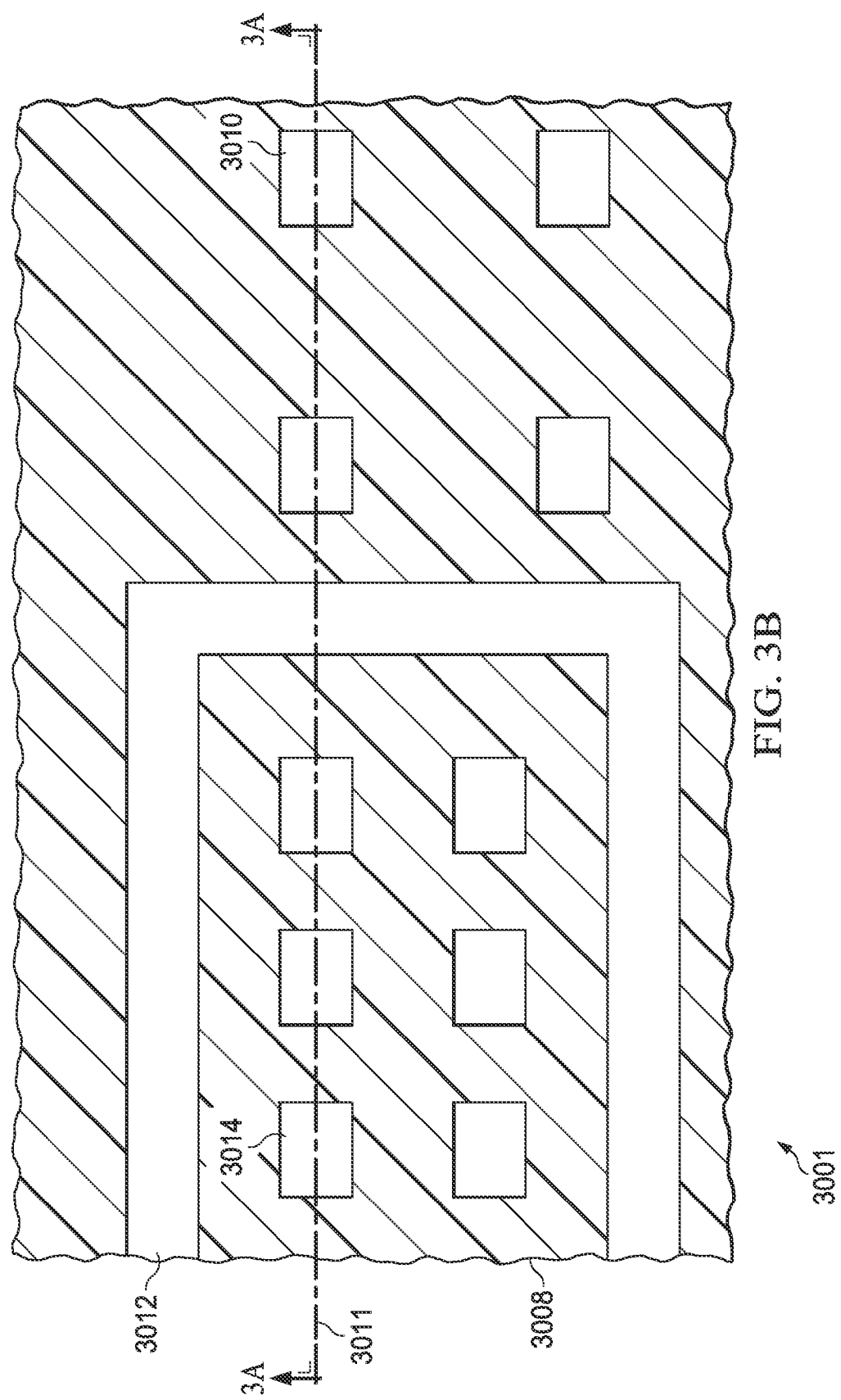

FIG. 3B is a top down view (3001) of the first contact photoresist pattern (3008). The first contact wall seal (3012) forms a trench which surrounds an area where the FeCap array will be built. The cross section in FIG. 3A is taken along the dotted line (3011) in FIG. 3B.

Figure 3C:
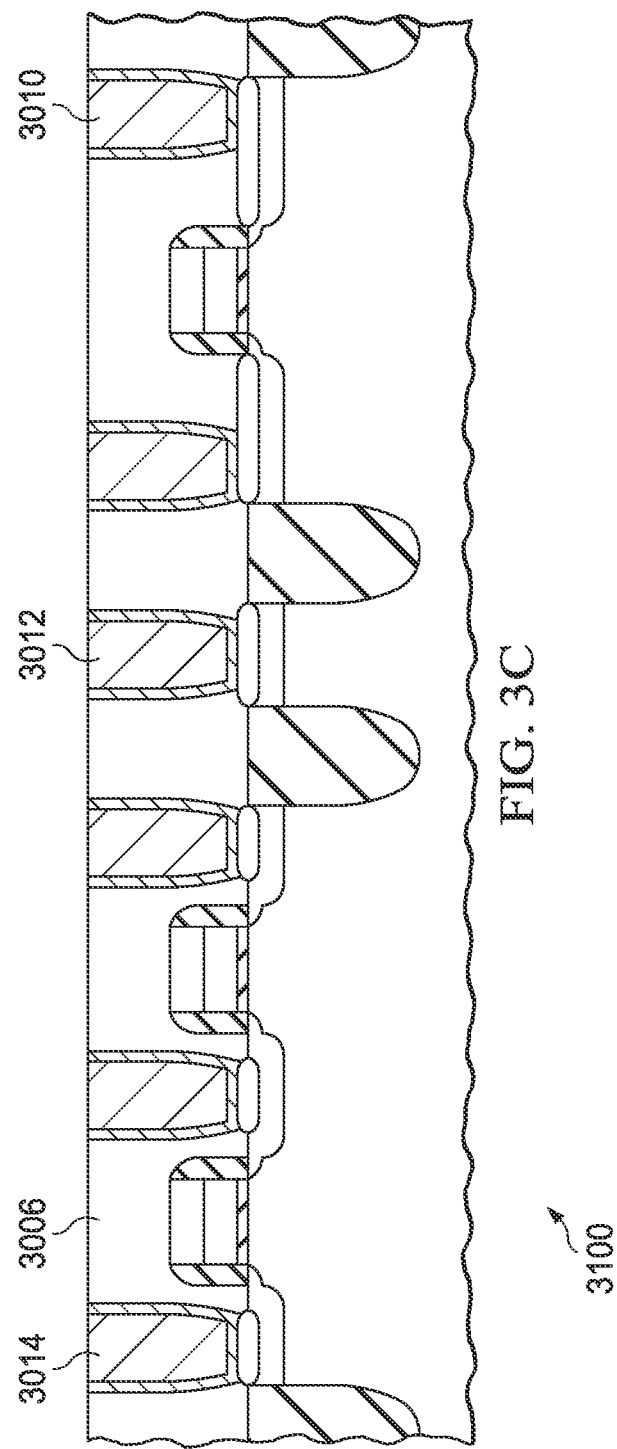

FIG. 3C shows a cross section of the FeCap integrated circuit (3100) after the first contacts (3010) and (3014) and the first contact wall seal (3012) have been etched in the PMD1 layer (3006) and filled using conventional processes. The first contacts (3010) and (3014) and the first contact wall seal (3012) may be lined with a material that is a good hydrogen barrier, such as TiN, TiAlN, or TiAlON, and they may subsequently be filled with CVD-W. Alternatively, the contacts may be lined with TaN and filled with copper.

Figure 3D:
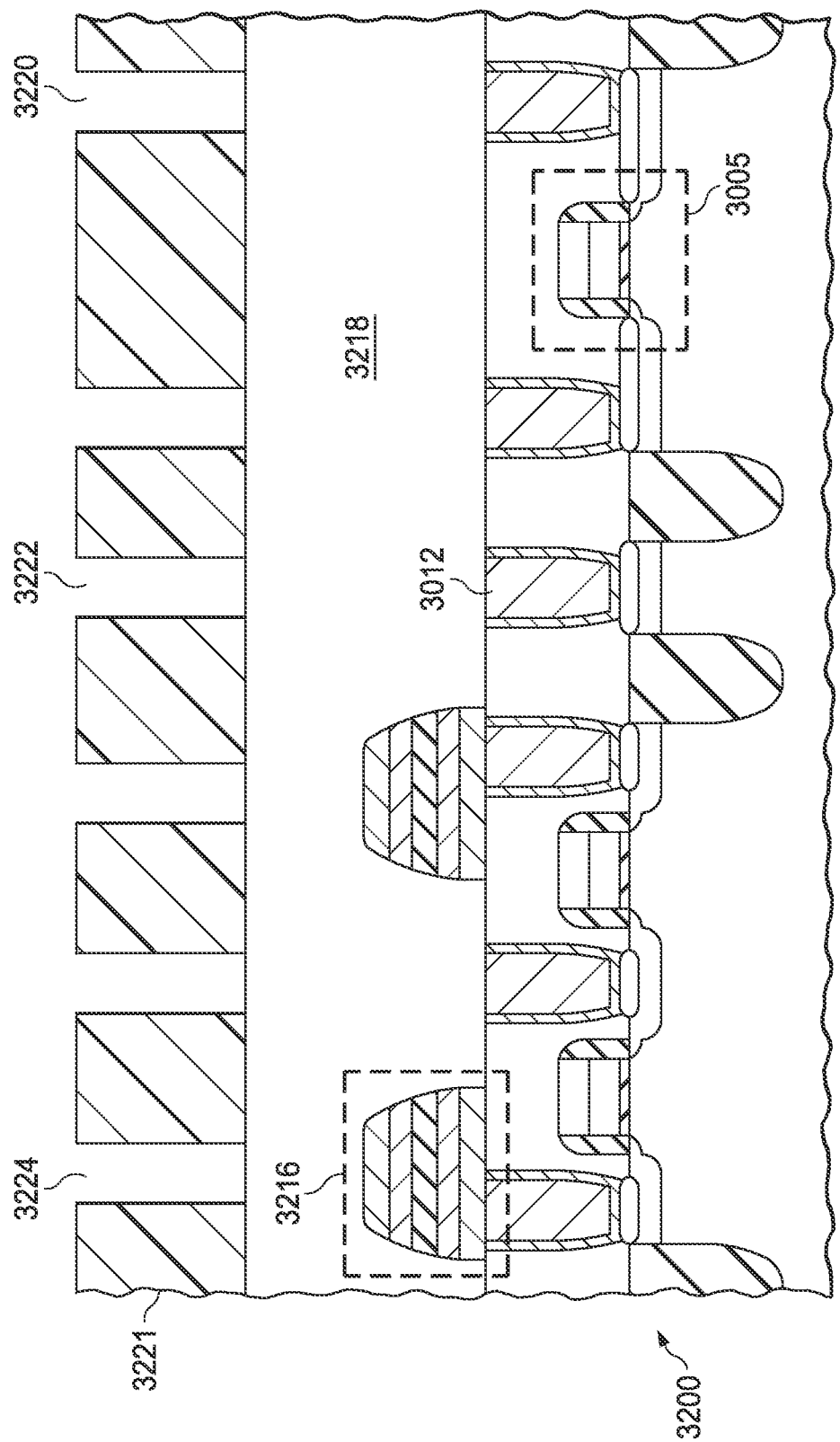

The FeCap integrated circuit (3200) in FIG. 3D is shown after the FeCaps (3216) have been formed and PMD2 (3218) deposited and planarized. A second contact photoresist pattern (3221) is formed on PMD2 (3218) with openings (3220) to form second contacts to transistors (3005), openings (3224) to form second contacts to the FeCap (3216) top electrode, and openings (3222) to form the second contact wall seal. Like the first contact wall seal (3012) shown in FIG. 3B, the second contact wall seal (3222) forms a trench that surrounds the FeCap array that contains FeCap (3216). This second contact wall seal (3222) may also have gaps where interconnect signal leads may pass to connect to the next layer (these gaps may prevent the second contact wall seal (3222) from shorting the signal leads).

Figure 3E:
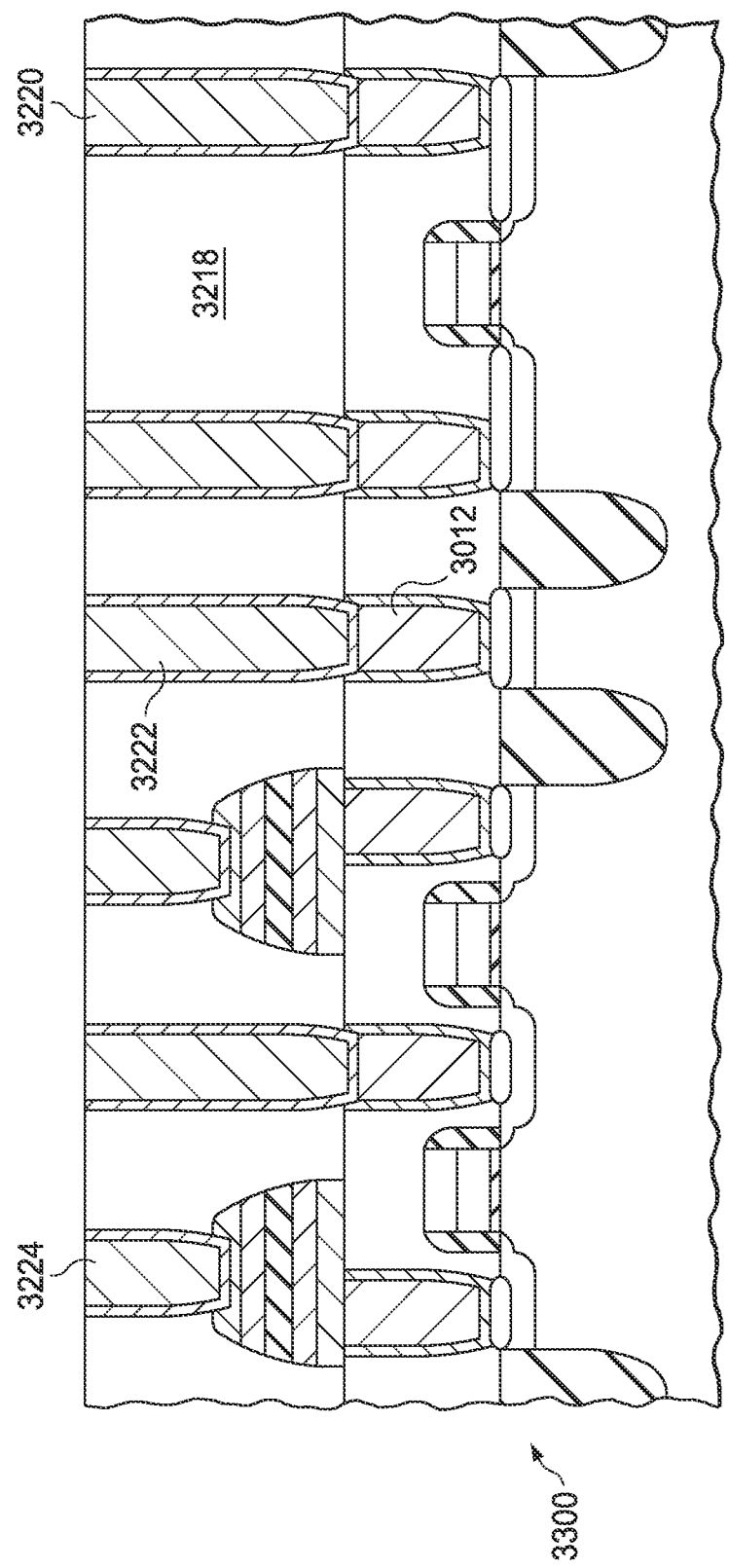

FIG. 3E shows FeCap integrated circuit (3300) after the second contacts (3224) and (3220) and second contact wall seal (3222) have been etched in PMD2 dielectric (3218), filled, and then planarized. The second contacts may be lined with a hydrogen barrier material such as TiN, TiAlN, or TiAlON and filled with CVD-W. Alternatively, they may be lined with a hydrogen barrier material such as TaN and filled with copper. The hydrogen barrier material which lines the second contact wall seal (3222) may prevent hydrogen from diffusing into the FeCap array from the sides. The second contact wall seal (3222) is formed on top of the first contact wall seal (3012) to form a continuous hydrogen barrier.

Figure 3F:
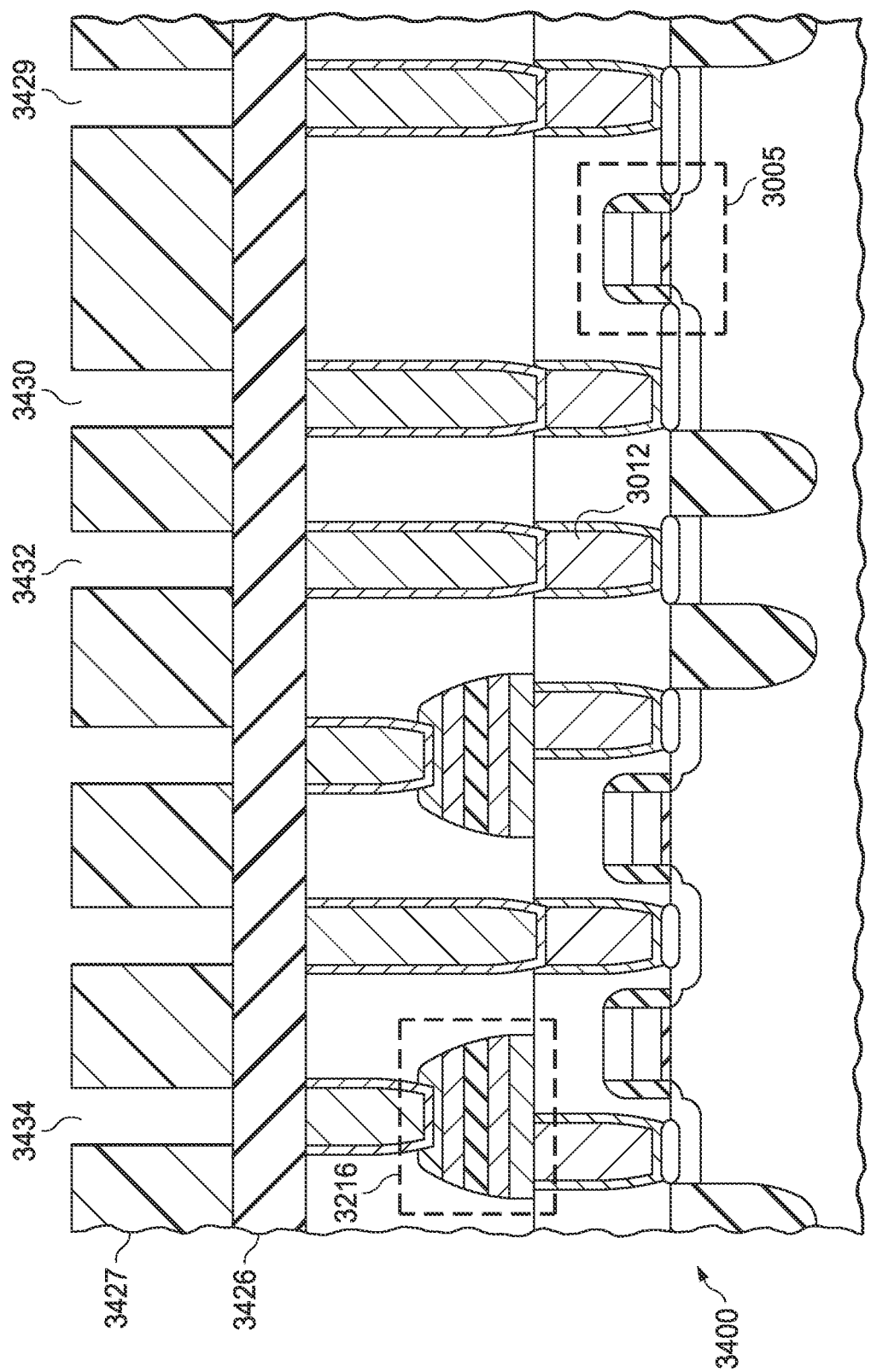

In the FeCap integrated circuit (3400) of FIG. 3F, the IMD1 dielectric (3426) is deposited and planarized. Then a metal-1 photoresist pattern (3427) is formed on IMD1 (3426) with openings for metal-1 interconnect signal leads (3429), (3430) to transistor (3005), metal-1 interconnect signal lead (3434) to the FeCap (3216) top electrode, and the metal-1 wall seal (3432).

Figure 3G:
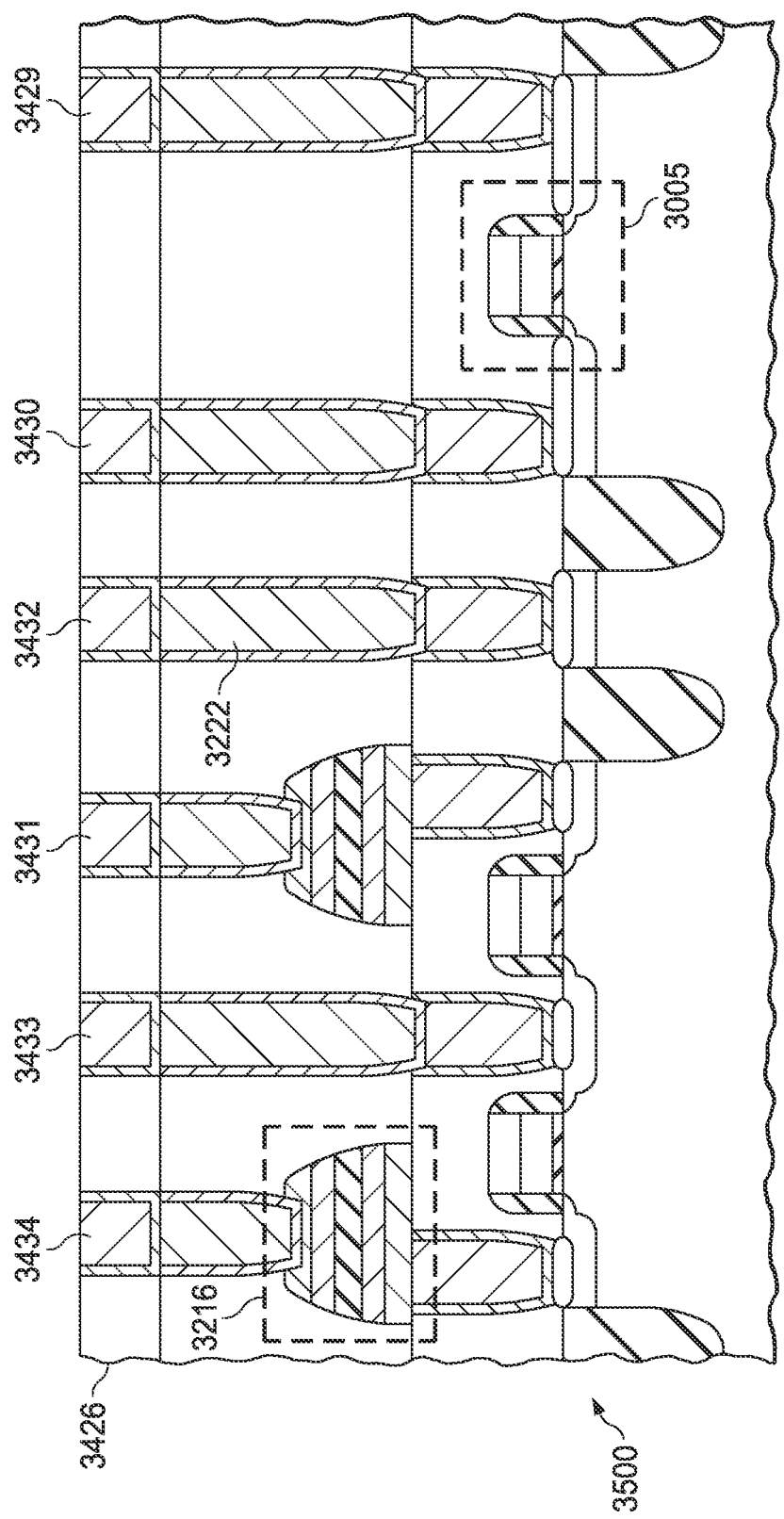

The metal-1 trenches have been etched in IMD1 (3426), filled with metal, and planarized in the FeCap integrated circuit (3500) of FIG. 3G. The metal-1 interconnect signal leads, (3429), (3430), (3431), (3433) and (3434), and metal-1 wall seal (3432) may be lined with a metallic hydrogen barrier material (such as TaN) and filled with a metal (such as copper). The metal-1 wall seal (3432) is built on top of the second contact wall seal (3222) to form a continuous hydrogen barrier. Gaps may be formed in the metal-1 wall seal to provide openings through which signal leads (3431), (3433), and (3434) may be routed.

Figure 3H:
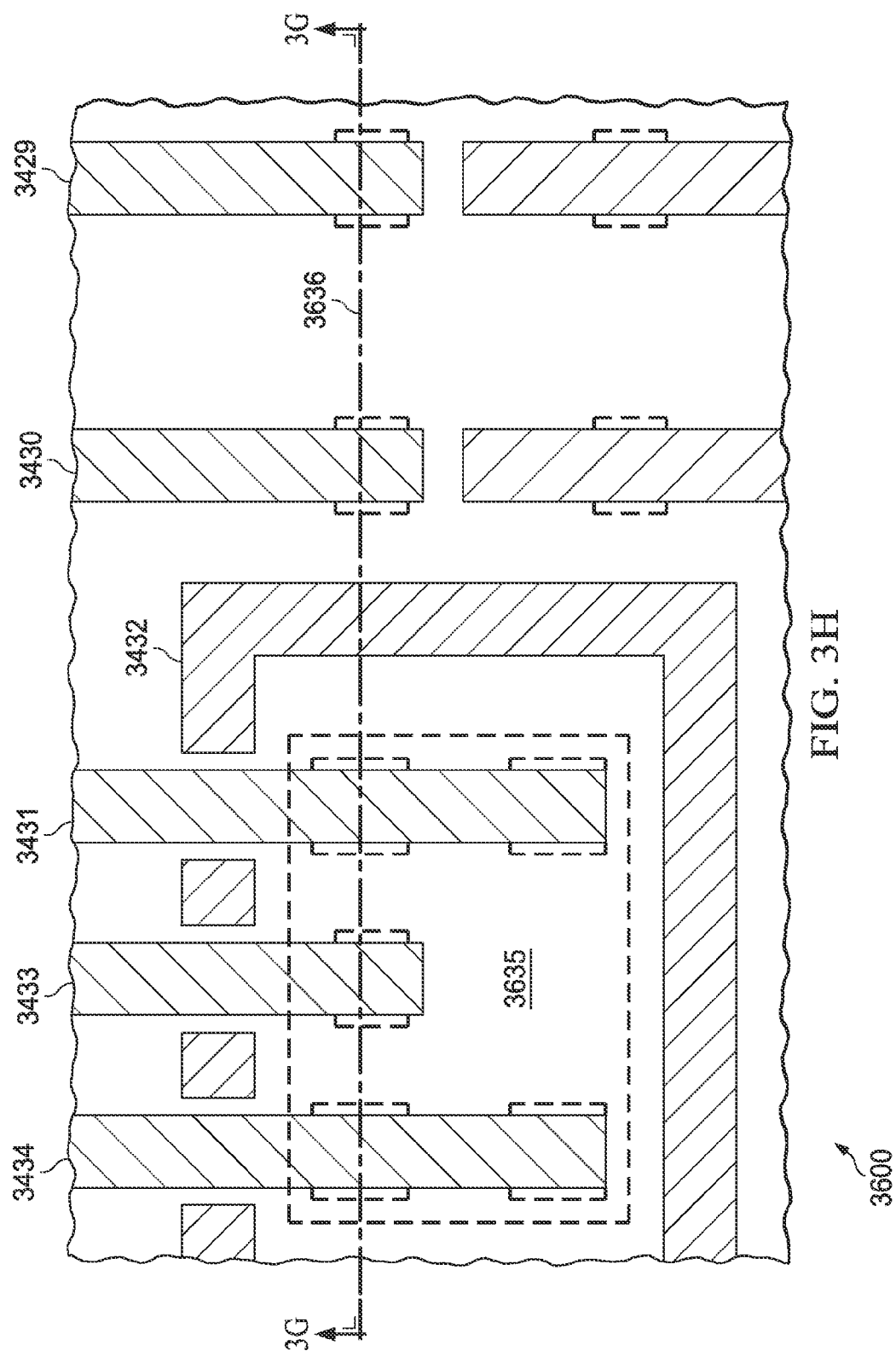

FIG. 3H shows a top down view (3600) of this example embodiment. The metal-1 wall seal (3432) forms a continuous wall seal around the FeCap array (3635) except for the gaps that the metal-1 leads (3431), (3433), and (3434) pass through to connect the FeCaps to the peripheral circuitry. (Note that the cross section in FIG. 3G is taken along line (3636) in FIG. 3H.)

FIGS. 3I, 3J, 3K, and 3L illustrate a dual damascene metal-2 process in which a via-1 wall seal (3742) and a metal-2 top plate seal (3948) are formed. Although a dual damascene process is used to illustrate the embodiment, a single damascene process may also be used.

Figure 3I:
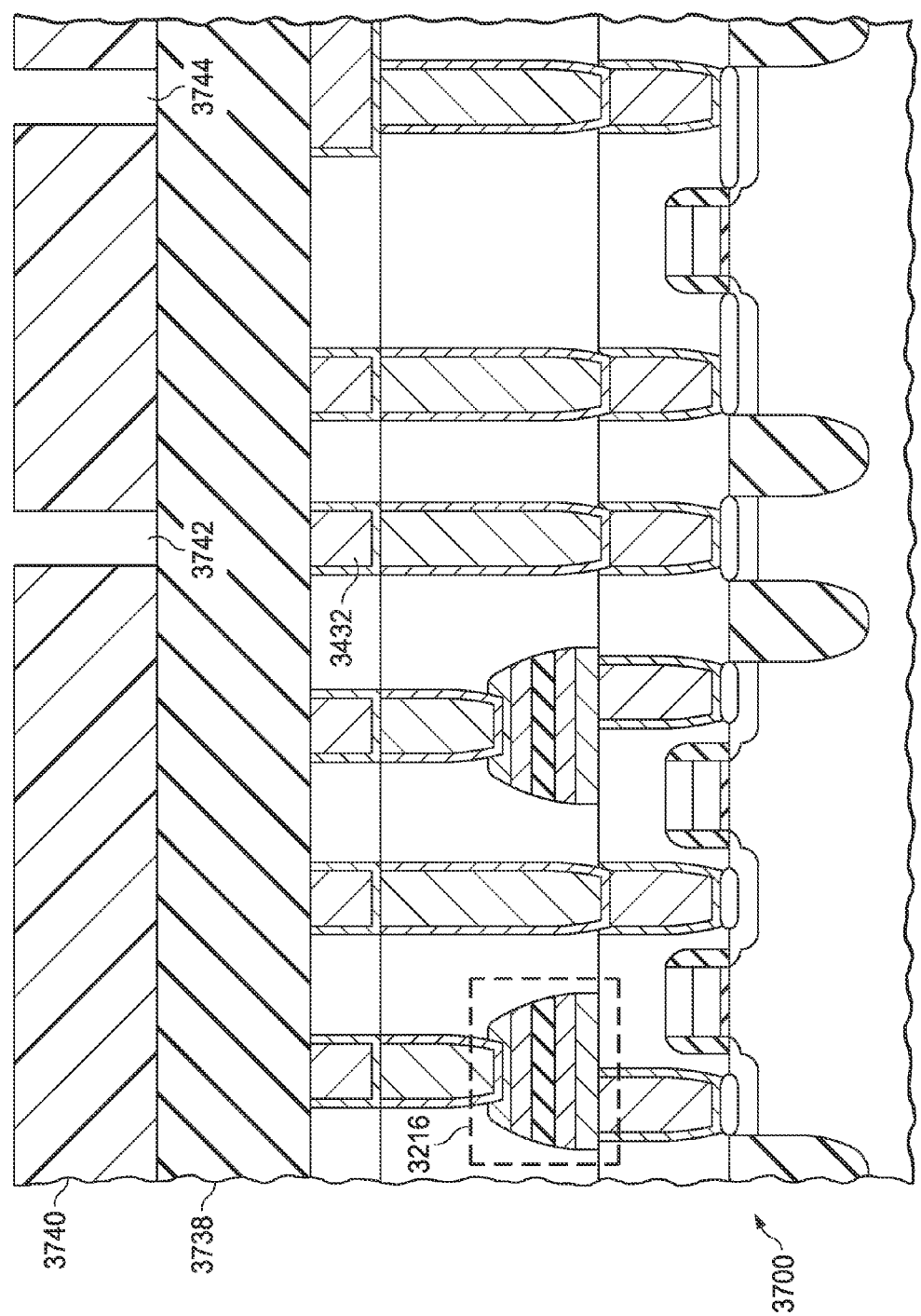

In the integrated circuit (3700) shown in FIG. 3I, a IMD2 dielectric layer (3738) is deposited on top of the integrated circuit (3500) of FIG. 3G and then planarized. A via-1 photoresist pattern (3740) is formed over the IMD2 dielectric layer (3738). The via-1 photoresist pattern (3740) has via-1 openings (3744), and a via-1 wall seal opening (3742). The via-1 wall seal (3742) is formed directly on top of the metal-1 wall seal (3432) of FIG. 3G.

Figure 3J:
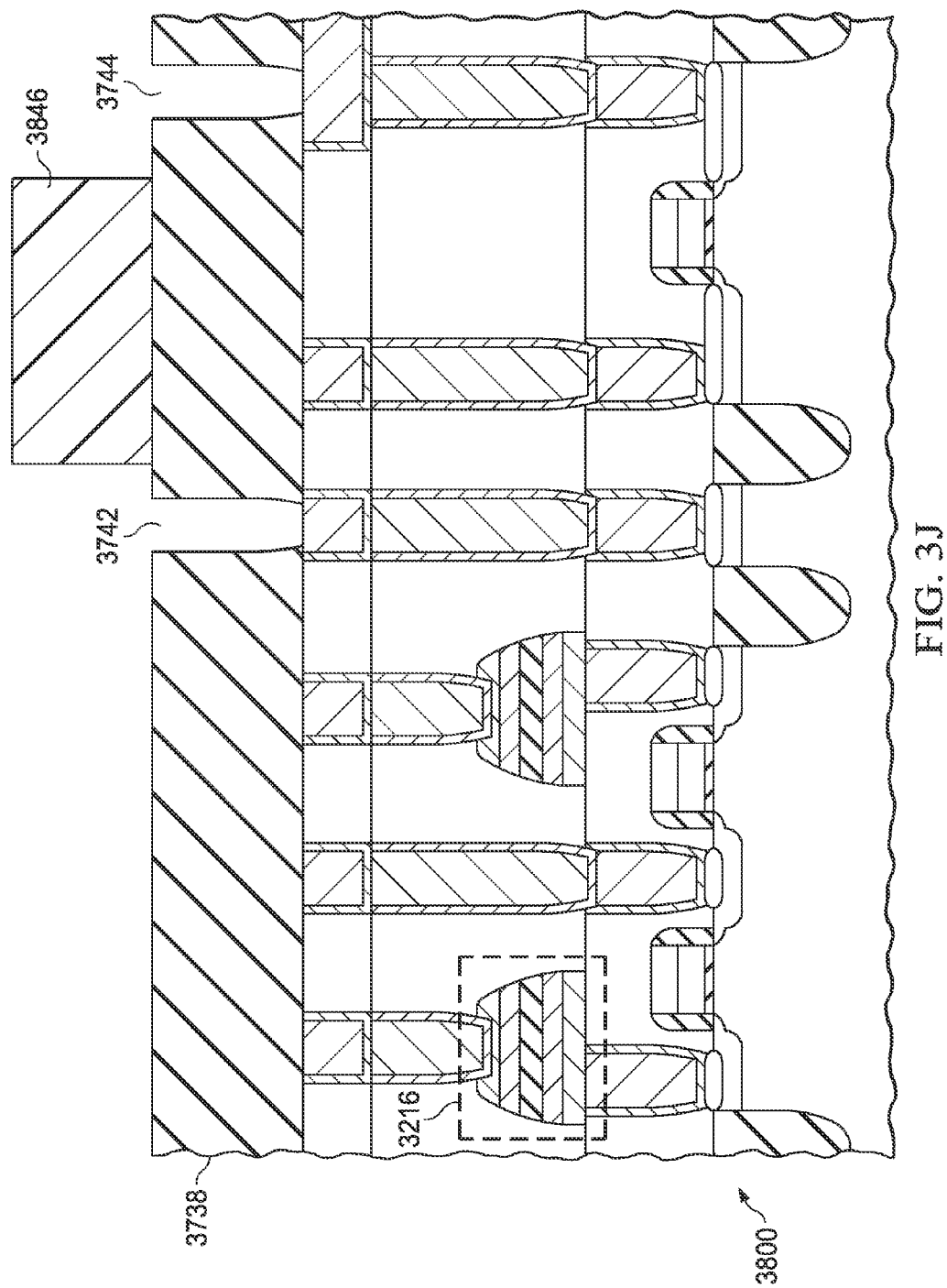

FIG. 3J shows the integrated circuit (3800) after the openings are etched in the IMD2 dielectric layer (3738) for the via-1 (3744) and via-1 wall seal (3742). FIG. 3J also shows a metal2 photoresist pattern (3846) formed on top of the etched IMD2 dielectric (3738).

The metal-2 lead (3950) and metal-2 top plate seal (3948) openings are etched in IMD2 (3738). Then, the openings for via-1 (3744), via-1 wall seal (3742), metal-2 lead (3950), and metal-2 top plate seal (3948) are filled with a conductive material and planarized, as shown in FIG. 3K The trench for the via-1 (3744), the trench for the via-1 wall seal (3742), the trench for the metal-2 lead (3950), and the trench for the metal-2 top plate seal (3948) may be lined with a metallic hydrogen barrier (such as TaN) before it is filled with conductive material (such as copper).

Figure 3K:
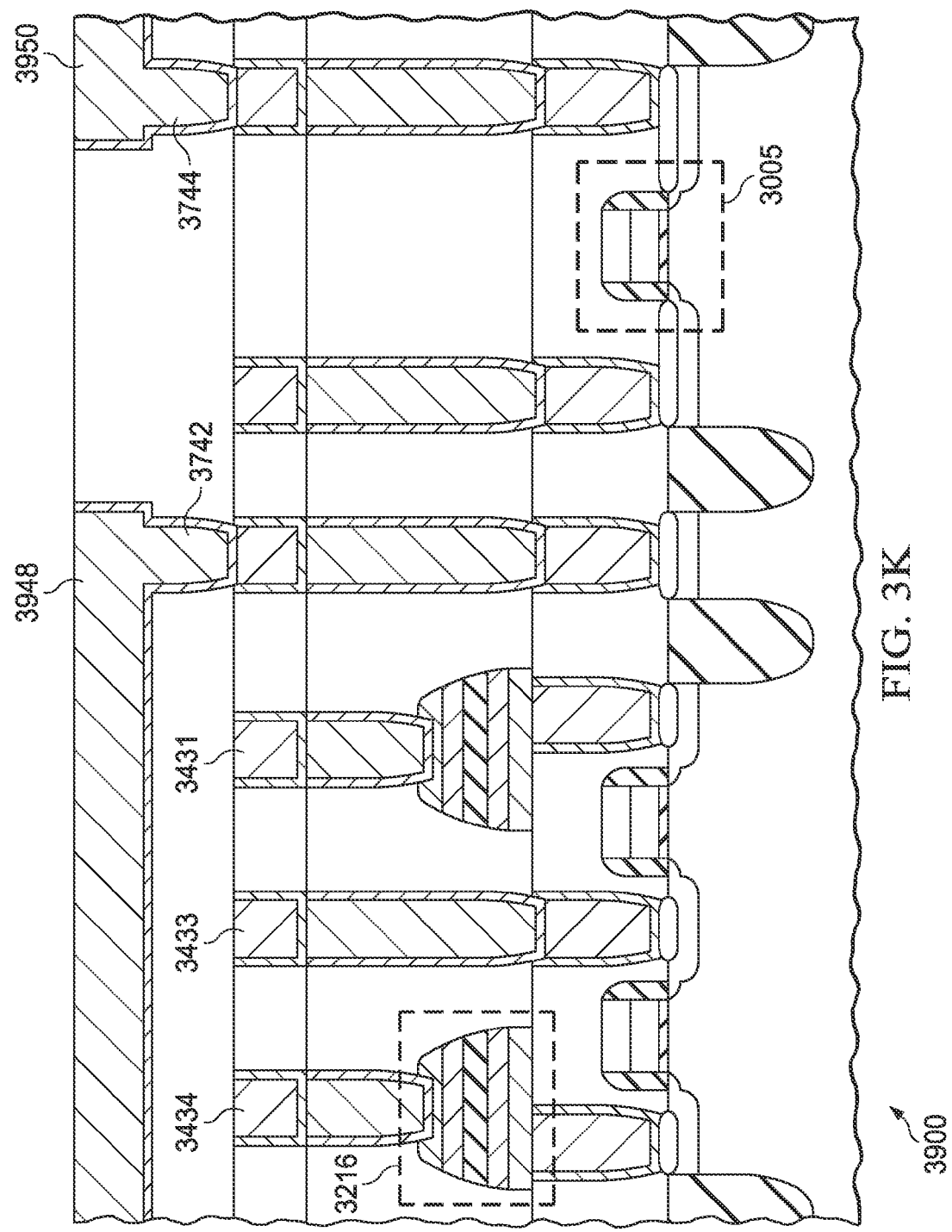
Figure 3L:
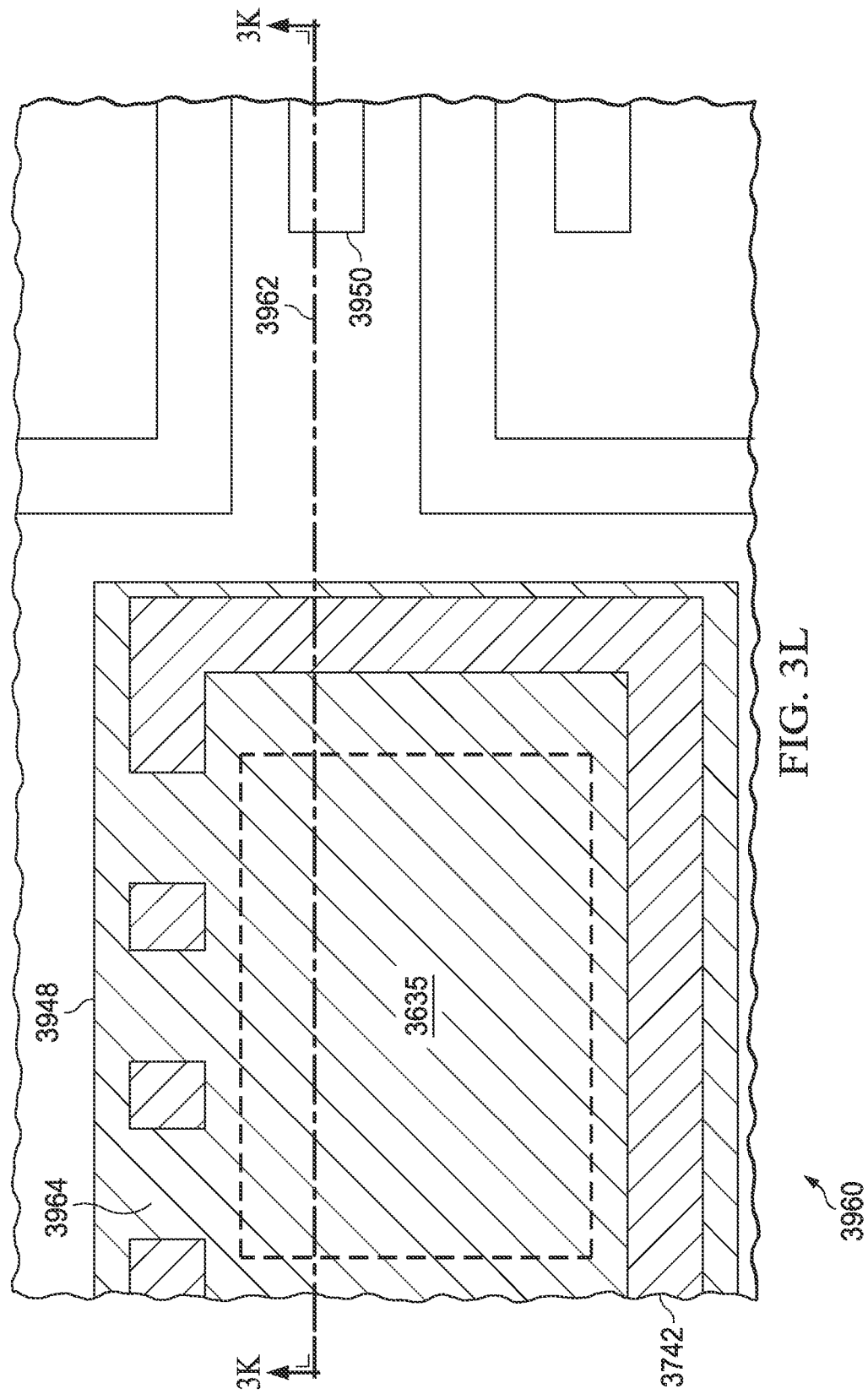

FIG. 3L shows a top down view (3960) of the metal-2 top plate seal (3948) and the metal-2 lead (3950) of FIG. 3K. The metal-2 lead (3950) carries signals to the drain of transistor (3005). The metal-2 top plate seal (3948) covers the top of the FeCap array (3635) and it also covers the via-1 wall seal (3742). The via-1 wall seal (3742) forms a continuous hydrogen barrier seal around the FeCap array (3635) except for the gaps (3964). The gaps (3964) may prevent the via-1 wall seal (3742) from shorting to the metal-1 signal leads (3431), (3433), and (3434) which pass underneath it one level below (see FIG. 3K). Moreover, the metal-2 top plate seal (3948) may block hydrogen diffusion from above and that may degrade the electrical properties of the FeCaps (3216) that are located in the FeCap array (3635). (Note that the cross section (3900) in FIG. 3K is through line (3962) in FIG. 3L.)

The illustrative embodiment shown in FIGS. 3I through 3L employs a dual damascene process that uses a TaN hydrogen barrier liner plus a copper fill metal. If design rules permit, an top plate seal that contains aluminum may also be used. In this case, the aluminum or aluminum copper may be deposited and then patterned and etched to form the top plate and signal leads.

Wall seals in the above example embodiment are formed by first etching trenches and then filling them with a hydrogen barrier material. The example embodiment is illustrated using a copper damascene process. Another method of forming wall seals may be to deposit a hydrogen barrier metal layer (such as aluminum) and then patterning and etching the metal layer to form a wall seal around the FeCap array.

Figure 4A:
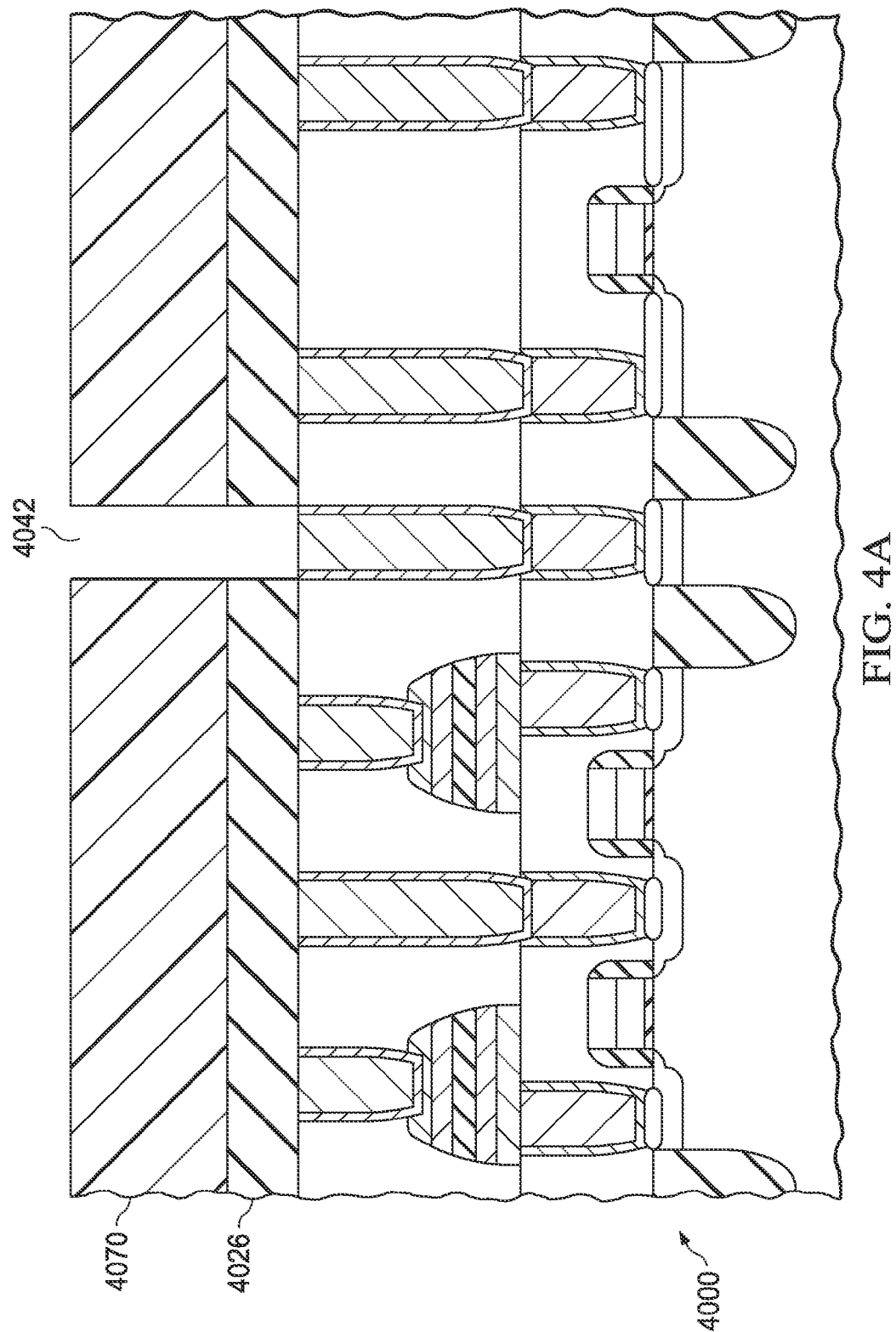
FIG. 4A through FIG. 4E are illustrations of steps in the fabrication of integrated circuits formed according to alternative embodiments.
Figure 4B:
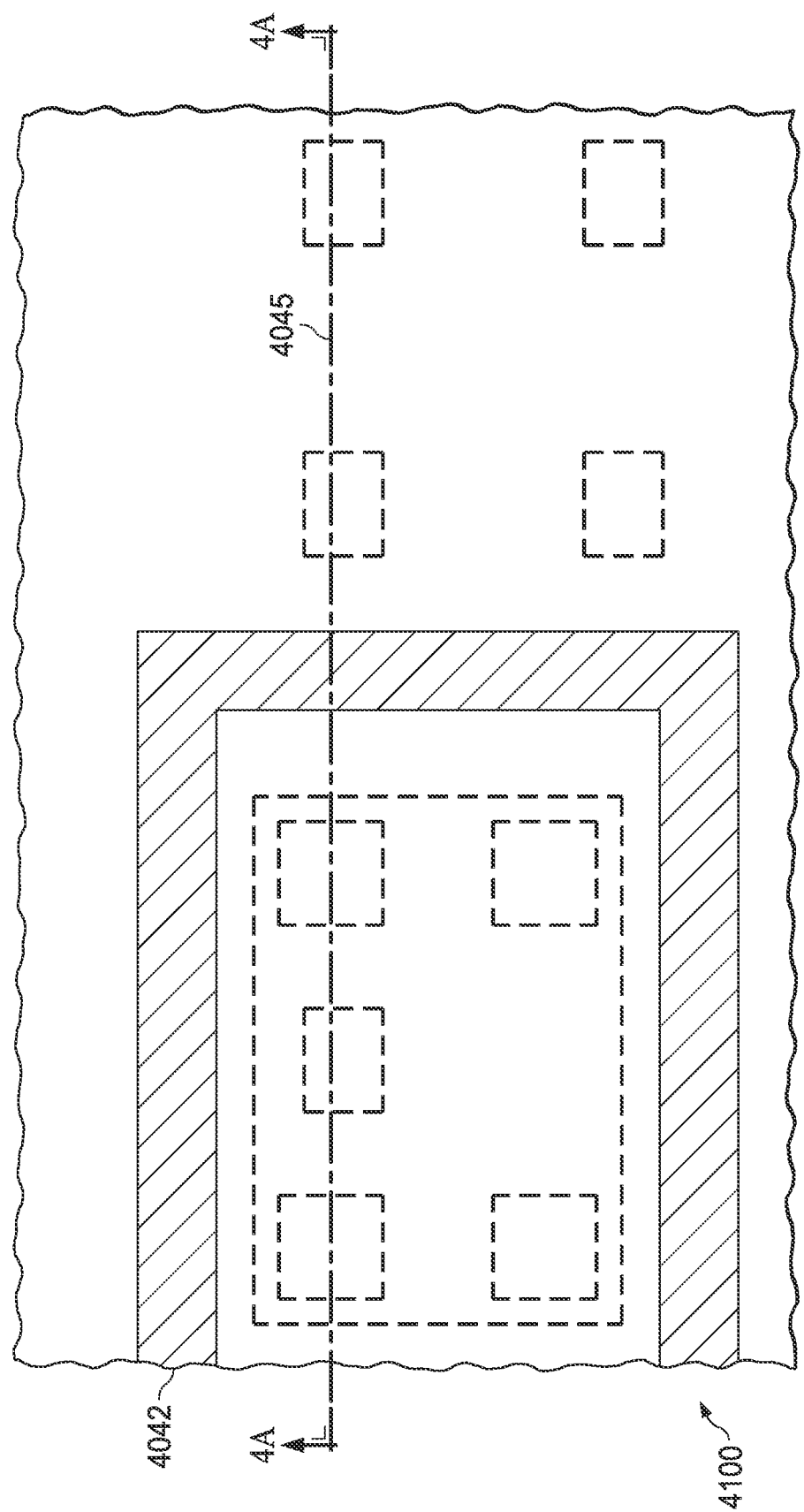

Another alternative embodiment for connecting interconnect signal leads from the FeCaps to the periphery circuitry with a hydrogen barrier is illustrated in FIGS. 4A-4E. The integrated circuit (4000) of FIG. 4A is the same as FIG. 3F with the exception that the metal-1 wall seal and metal-1 interconnect photoresist pattern (3427) is replaced with a wall seal photoresist pattern (4070). Therefore, this pattern exposes an opening for a wall seal (4042) only. After the trench for the wall seal (4042) is etched in the IMD1 dielectric (4026) (and photoresist pattern is removed) it may be filled with a dielectric hydrogen barrier material such as SiN and then planarized. A top down view of the resultant structure is shown in the integrated circuit (4100) of FIG. 4B. Note that the cross section in FIG. 4A is taken along line (4045) in FIG. 4B.

Figure 4C:
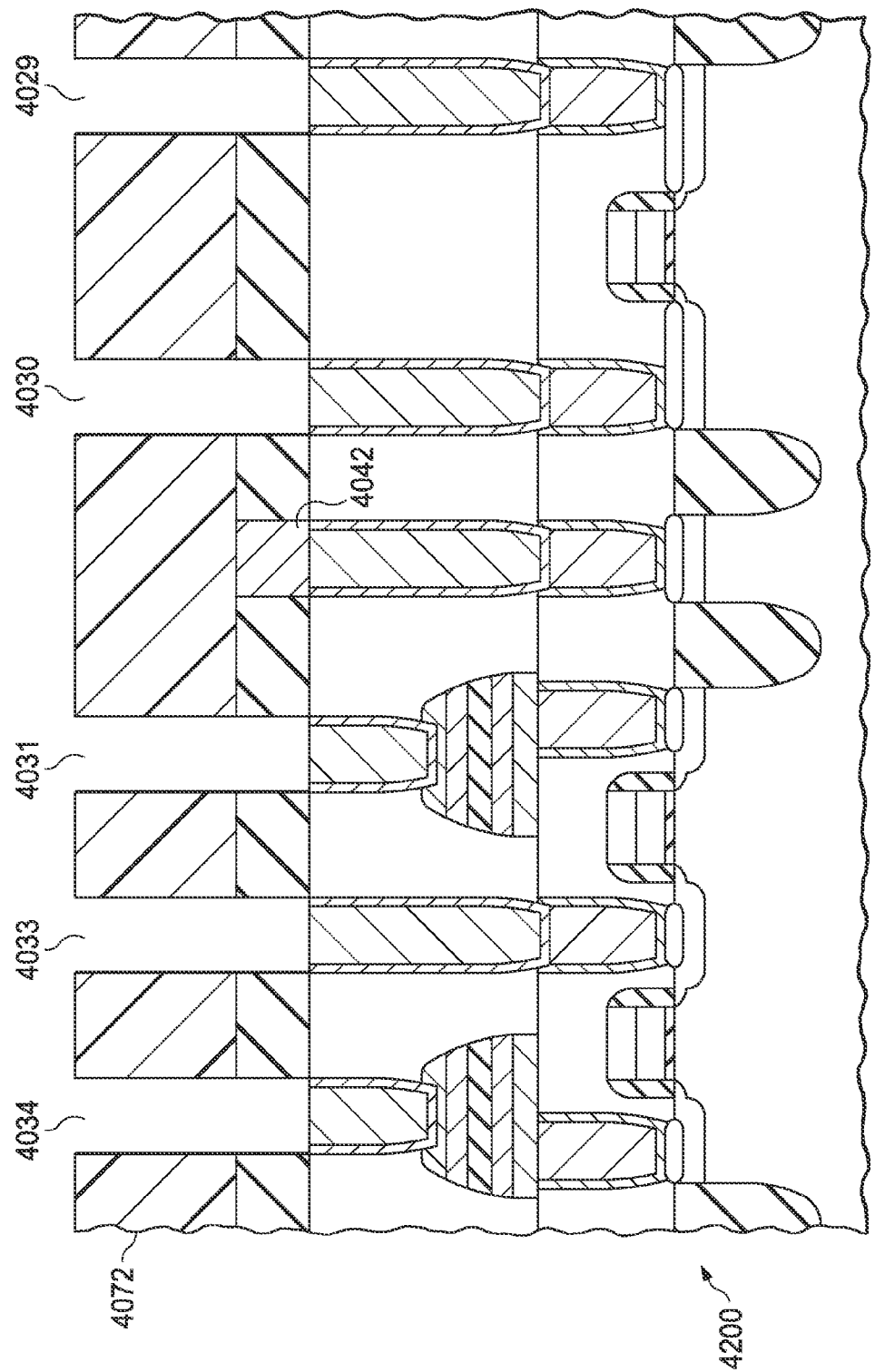
Figure 4D:
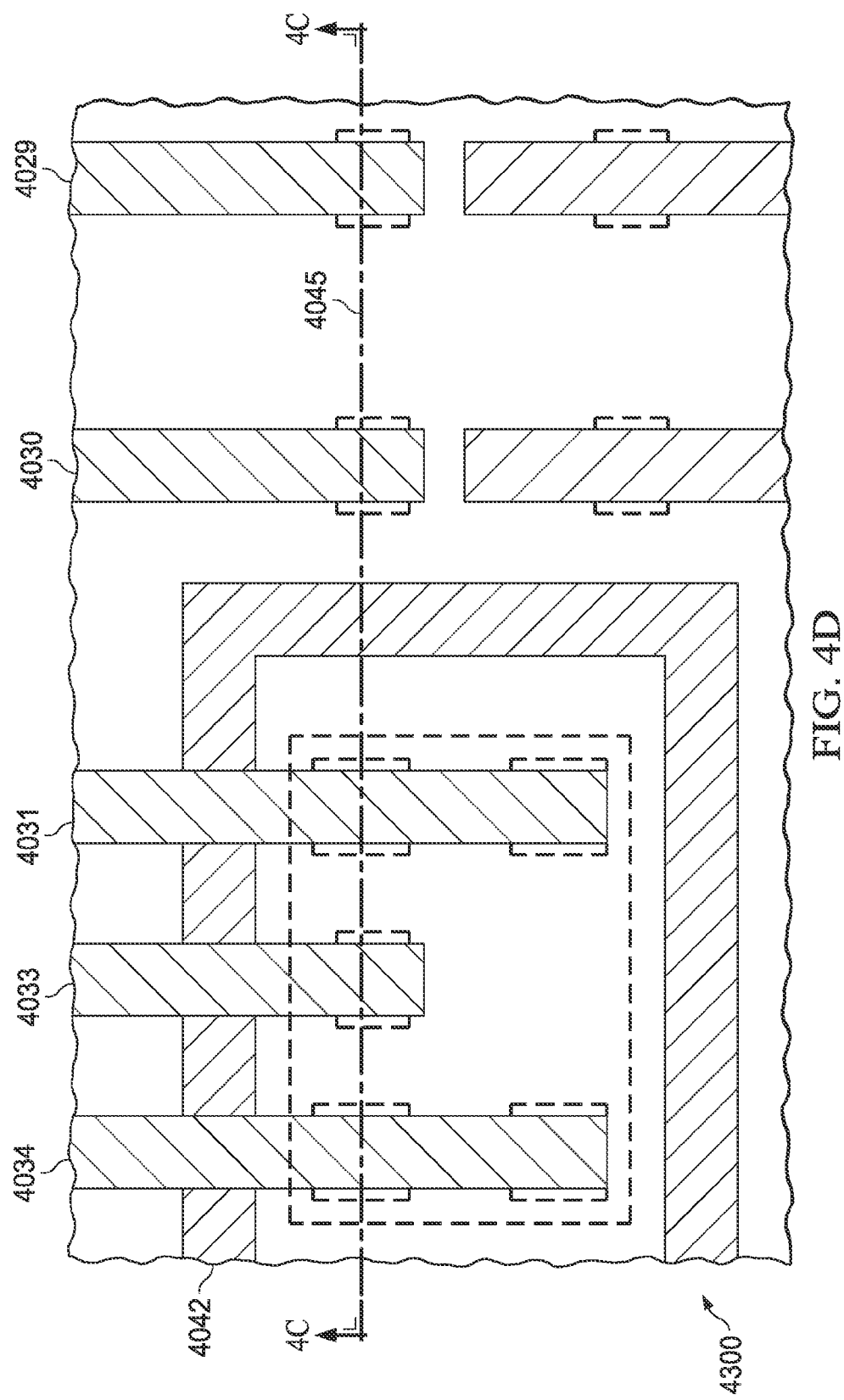

A metal-1 interconnect photoresist pattern (4072) is then formed with openings (4029), (4030), (4031), (4033), and (4034) for the metal-1 leads, as shown in integrated circuit (4200) of FIG. 4C. As shown in the top down view of integrated circuit (4300) in FIG. 4D, the trenches for the metal-1 leads (4031), (4033), and (4034), that connect the FeCaps to the periphery circuit are etched through the wall seal (4042). These trenches may then be lined with a metallic hydrogen barrier material such as TaN and before being filled with a metal interconnect material such as copper. (Note that the cross section in FIG. 4C is taken along line (4045) in FIG. 4D.)

Figure 4E:
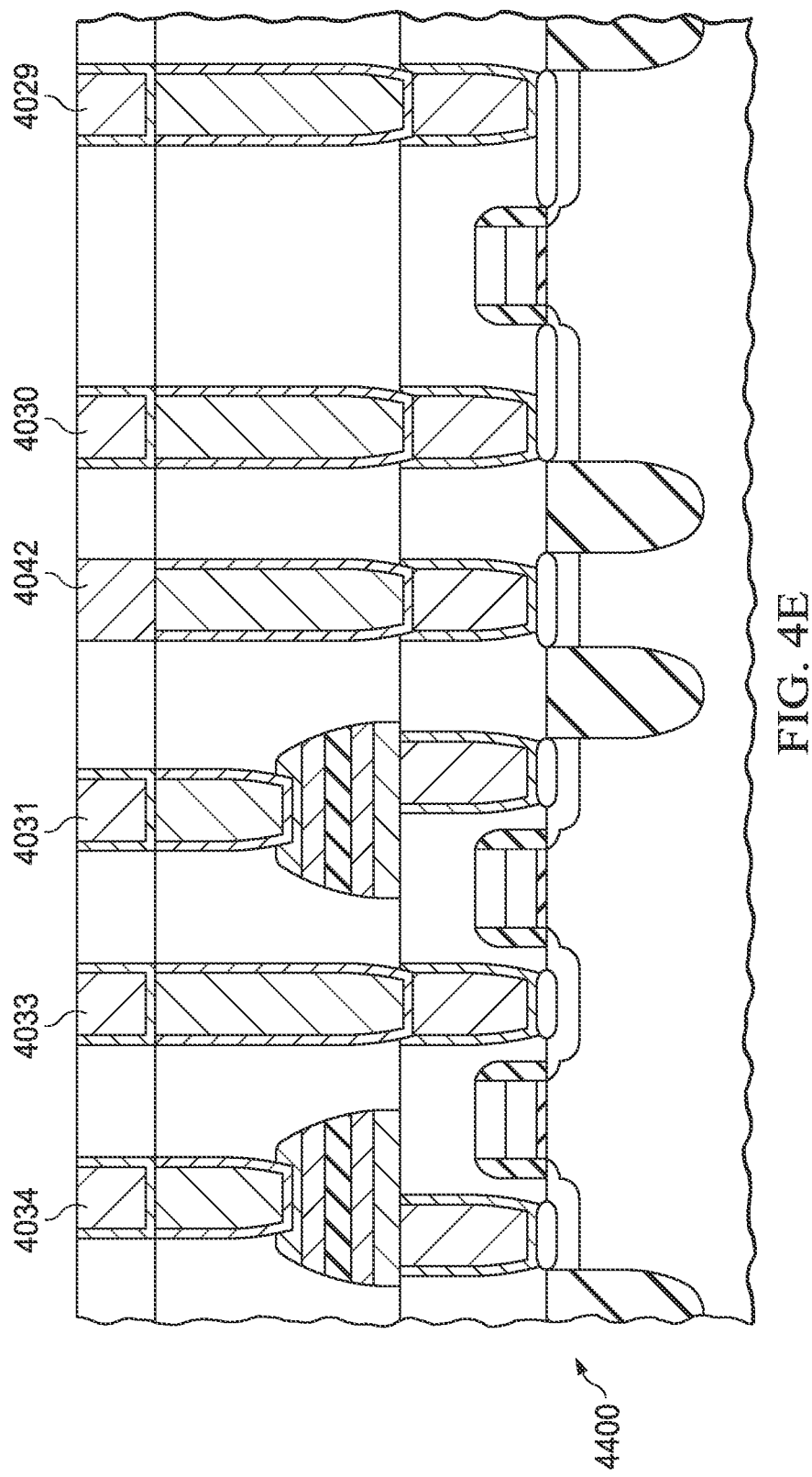

FIG. 4E is a cross section of integrated circuit (4400) showing the dielectric wall seal (4042) and metal leads (4029), (4030), (4031), (4033), and (4034) according to this embodiment. Additional processing (as is shown in FIGS. 3I through 3L) may then be performed. This embodiment adds cost, but it also may form a higher integrity hydrogen seal around the FeCap array, since no gaps are formed between the dielectric wall seal (4042) and a signal lead such as (4034) through which hydrogen may diffuse.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process for forming an integrated circuit, comprising:
   providing a substrate having transistors, a first pre-metal dielectric, and a contact photoresist pattern for a contact wall seal surrounding a FeCap area;
   forming at least one contact wall seal that is at least partially filled with a first hydrogen barrier material wherein said first hydrogen barrier material covers the walls of said at least one contact wall seal;
   forming at least one metal-1 wall seal that is at least partially filled with a second hydrogen barrier material wherein said second hydrogen barrier material covers the walls of said at least one metal-1 wall seal;
   forming at least one via wall seal that is at least partially filled with a third hydrogen barrier material wherein said third hydrogen barrier material covers the walls of said at least one via wall seal;
   forming a top plate seal over said FeCap array, said top plate seal being over and in contact with one of said at least one via wall seal;
   wherein said step of forming said at least one metal-1 wall seal includes forming a metal-1 wall seal with a gap, wherein at least one interconnect signal lead passes through said gap.

2. The process of claim 1 wherein said first hydrogen barrier is at least one of TiN, TiAlN, and TiAlON, and wherein said contact wall seal is filled with CVD-W.

3. The process of claim 1 wherein said third hydrogen barrier material is at least one of TaN, TaON, and TiN and wherein said at least one via wall seal is filled with Cu.

4. The process of claim 1 wherein said forming said top plate seal further comprises:
   forming a photoresist pattern on top of a dielectric layer, said dielectric layer containing a trench for a via wall seal;
   etching said dielectric layer to form a trench for an interconnect signal lead and a trench for said top plate seal;
   forming a TaN barrier layer on a bottom and sides of said via wall seal trench, said interconnect signal lead trench, and said top plate seal trench; and
   filling said via wall seal trench, said interconnect signal lead trench, and said top plate seal trench with copper.

5. The process of claim 1 wherein said forming said top plate seal further comprises:

forming a photoresist pattern on top of a dielectric layer, said dielectric layer containing a trench for a via wall seal;

etching said dielectric layer to form a trench for an interconnect signal lead and a trench for said top plate seal;

forming a layer of conductive hydrogen barrier material on a bottom and sides of said via wall seal trench, said interconnect signal lead trench, and said top plate seal trench; and filling said via wall seal trench, said interconnect signal lead trench, and said top plate seal trench with copper.

6. The process of claim 5 wherein said layer of conductive hydrogen barrier material is at least one of TiN, TiW, Al, AlCu, AlTi+AlCu, and TiW+AlCu.

7. The process of claim 1 wherein one of said at least one via wall seal is formed on top of and in contact with one of said at least one metal-1 wall seal, and further wherein one of said at least one metal-1 wall seal is formed on top of and in contact with said one of said at least one contact wall seal.

\* \* \* \* \*